US 12,069,832 B2

(12) United States Patent
Henley et al.

(10) Patent No.: US 12,069,832 B2
(45) Date of Patent: Aug. 20, 2024

(54) BUNDLED CABLE ASSEMBLY

(71) Applicant: CORNING RESEARCH & DEVELOPMENT CORPORATION, Corning, NY (US)

(72) Inventors: Joshua David Henley, Denver, NC (US); Christopher Shawn Houser, Hickory, NC (US)

(73) Assignee: Corning Research & Development Corporation, Corning, NY (US)

( * ) Notice: Subject to any disclaimer, the term of this patent is extended or adjusted under 35 U.S.C. 154(b) by 0 days.

(21) Appl. No.: 18/482,267

(22) Filed: Oct. 6, 2023

(65) Prior Publication Data

US 2024/0164044 A1 May 16, 2024

Related U.S. Application Data

(60) Provisional application No. 63/425,350, filed on Nov. 15, 2022.

(51) Int. Cl.
*H05K 7/14* (2006.01)
*H05K 5/02* (2006.01)

(52) U.S. Cl.
CPC ......... *H05K 7/1491* (2013.01); *H05K 5/0247* (2013.01)

(58) Field of Classification Search
CPC .............. G02B 6/4452; G02B 6/44528; G02B 6/4475; G02B 6/4472; G02B 6/4471; H05K 7/1491; H05K 5/0247
See application file for complete search history.

(56) References Cited

U.S. PATENT DOCUMENTS 6,522,814 B2  2/2003  Yoshida et al.
7,756,371 B1 * 7/2010  Burnham ............. G02B 6/4472
                                                  398/55
(Continued)

FOREIGN PATENT DOCUMENTS

CN      101887153 A    11/2010
CN      201749240 U     2/2011
(Continued)

OTHER PUBLICATIONS

International Search Report and Written Opinion of the International Searching Authority; PCT/US2023/036668; dated Feb. 23, 2024; 14 pages; European Patent Office.

*Primary Examiner* — Patrick D Hawn
(74) *Attorney, Agent, or Firm* — Adam R. Weeks

(57) ABSTRACT

A bundled cable assembly comprises groups of jumpers arranged to define a main section and terminal sections that each extend from the main section. The main section includes a plurality of tap locations at spaced apart locations along a length of the main section. At least some of the jumpers are bundled together in the main section between the tap locations. The terminal sections each extend from one of the tap locations. Each of the jumpers includes a first jumper end in one of the terminal sections and a second jumper end in another of the terminal sections. The groups of jumpers are arranged such that each of the terminal sections comprises the first jumper ends the jumpers from a respective group of the groups of jumpers and at least one second jumper end from each of the other groups of jumpers.

21 Claims, 7 Drawing Sheets

(56) References Cited

U.S. PATENT DOCUMENTS

| | | | | |
|---|---|---|---|---|
| 8,391,663 | B2* | 3/2013 | Carter | G02B 6/4452 |
| | | | | 385/100 |
| 8,485,737 | B2* | 7/2013 | Kolesar | G02B 6/4472 |
| | | | | 385/24 |
| 8,879,882 | B2* | 11/2014 | Conner | G02B 6/4471 |
| | | | | 385/134 |
| 9,097,874 | B2* | 8/2015 | Coleman | G02B 6/4472 |
| 9,164,250 | B2* | 10/2015 | Mogul | G02B 6/44526 |
| 9,829,651 | B2* | 11/2017 | Hall | G02B 6/40 |
| 10,459,183 | B2* | 10/2019 | Mitobe | G02B 6/44526 |
| 10,585,257 | B1 | 3/2020 | Smith | |
| 10,678,012 | B1* | 6/2020 | Wu | G02B 6/4471 |
| 10,948,678 | B2 | 3/2021 | Cooke et al. | |
| 11,209,604 | B2 | 12/2021 | Yokokawa et al. | |
| 11,269,152 | B2* | 3/2022 | Bell | G02B 6/4453 |
| 11,409,067 | B2* | 8/2022 | Van Baelen | G02B 6/4471 |
| 11,880,082 | B2* | 1/2024 | Cao | G02B 6/4475 |
| 2003/0016925 | A1* | 1/2003 | Sun | G02B 6/4472 |
| | | | | 385/115 |
| 2014/0105539 | A1* | 4/2014 | Conner | G02B 6/4471 |
| | | | | 385/24 |
| 2014/0270636 | A1* | 9/2014 | Manes | G02B 6/4472 |
| | | | | 385/24 |
| 2015/0063771 | A1 | 3/2015 | Mogul et al. | |
| 2015/0279517 | A1 | 10/2015 | Boudreaux | |
| 2019/0137713 | A1 | 5/2019 | Mitobe et al. | |
| 2022/0043226 | A1 | 2/2022 | Andrus et al. | |
| 2022/0357542 | A1* | 11/2022 | Cooke | G02B 6/4475 |
| 2024/0111115 | A1* | 4/2024 | Faulkner | G02B 6/4475 |

FOREIGN PATENT DOCUMENTS

| | | |
|---|---|---|
| EP | 0038861 A1 | 11/1981 |
| EP | 2157461 A1 | 2/2010 |
| JP | 03-156316 A | 7/1991 |

* cited by examiner

BUNDLED CABLE ASSEMBLY

PRIORITY APPLICATION

This application claims the benefit of priority of U.S. Provisional Application No. 63/425,350, filed on Nov. 15, 2022, the content of which is relied upon and incorporated herein by reference in its entirety.

BACKGROUND

This disclosure relates generally to telecommunication cable assemblies, such as optical cable assemblies. More particularly, this disclosure relates to groups of individual cable assemblies that are bundled together to form a larger "bundled" cable assembly.

The ever-increasing demand for data has resulted in the development of large, scalable data centers to store and process this data. Some modern data centers are referred to as "hyperscale" data centers due to their size and scalability. For example, a typical hyperscale data center includes several thousand servers housed within multiple data halls, which are large areas (e.g., 10,000+ square feet) containing many rows of many equipment racks. The large number of equipment racks are needed to not only support the servers, but also switches and other networking equipment that forms part of a communication network for the data center.

In some data center architectures, groups of servers are networked together to form clusters or pods where parallel processing takes place for high-performance computing. The network links within a cluster are typically achieved by optical fiber cable assemblies that route between the network equipment (e.g., switches and servers). In many cases the optical fiber cable assemblies are in the form of patch cords (also referred to as "jumper cables" or "jumpers"), which include one or more optical fibers carried within a cable and a connector on each end of the cable that terminate the optical fiber(s). The large number of jumper cables that are typically needed to connect the network equipment in a cluster can make the cabling infrastructure difficult and/or time-consuming to install.

For example, installation technicians at a data center may need to first locate packs of jumpers that have been shipped to the facility and bring them to a common location for unpacking and labeling. The labeling includes placing intended location data on or near the ends of each jumper. The intended location data may include information that identifies which port on which network equipment is intended for the jumper end, along with where that network equipment may be located within the cluster (e.g., which equipment rack in which row). Oftentimes the network equipment intended for a jumper's two ends is located in different equipment racks in a row of equipment racks. Once labelled, the jumpers are then typically installed one-at-a-time by technicians. This involves routing the jumpers in overhead cable trays between two equipment racks and evening out cable slack at that may be present at the two equipment racks. The jumper ends then are connected ("patched") to their intended ports on the network equipment at the two equipment racks.

Once the steps mentioned above are completed for the many jumpers that are needed in a typical high-performance computing cluster, there is still a need for post-routing organization of the jumpers in the cable trays and at the equipment racks. This process of post-routing organization is sometimes referred to as "grooming," "dressing," or "combing," and can take considerable time.

As can be appreciated, installing cabling infrastructure for high-performance computing clusters can be very labor intensive and time-consuming. The same challenges may exist elsewhere in a data center as well, as there are many different data center architectures that require network equipment to be interconnected for parallel processing.

SUMMARY

Embodiments of a bundled cable assembly are provided along with methods of making and using the same. The bundled cable assembly may be used for interconnecting network equipment that is supported in different equipment racks, such as network equipment in a series of equipment racks that form part of a mesh network.

According to one embodiment, a bundled cable assembly comprises n groups of jumpers arranged to define a main section and n terminal sections that each extend from the main section, n being an integer$\geq 4$. The main section includes a plurality of tap locations at spaced apart locations along a length of the main section. At least some of the jumpers from each of the n groups of jumpers are bundled together in the main section between the plurality of tap locations. The n terminal sections each extend from one of the tap locations. Additionally, each of the n groups comprises $m*(n-1)$ jumpers, with m being an integer$\geq 1$. Each of the $m*(n-1)$ jumpers includes a first jumper end in one of the n terminal sections and a second jumper end in another of the n terminal sections. The n groups of jumpers are arranged such that each of the terminal sections comprises the first jumper ends of the $m*(n-1)$ jumpers from a respective group of the n groups of jumpers and at least one second jumper end from each of the other n groups of jumpers.

According to another embodiment, a bundled cable assembly is provided for interconnecting network equipment that is supported in a series of n equipment racks, wherein n is an integer$\geq 4$. The bundled cable assembly comprises: a first end section for connecting to network equipment in a first equipment rack of the n equipment racks; a second end section for connecting to network equipment in a last equipment rack of the n equipment racks; a main section extending between the first end section and the second end section; a plurality of tap locations at spaced apart locations along a length of the main section; and a plurality of tap sections for connecting to network equipment in a plurality of equipment racks of the n equipment racks that are between the first equipment rack and the last equipment rack. Each tap section of the plurality of tap sections extends from a respective tap location of the plurality of tap locations. The first end section, the plurality of tap sections, and the second end section define terminal sections of the bundled cable assembly. Additionally, the bundled cable assembly is defined by n groups of jumpers that are bundled together in at least some of the main section. The jumpers of the n groups each have a first jumper end and a second jumper end. Each of the terminal sections comprises the first jumper ends from a respective one of the n groups of jumpers and at least one second jumper end from each of the other n groups of jumpers.

Additional features and advantages will be set out in the detailed description which follows, and in part will be readily apparent to those skilled in the technical field of optical connectivity. It is to be understood that the foregoing general description, the following detailed description, and the accompanying drawings are merely exemplary and intended to provide an overview or framework to understand the nature and character of the claims.

BRIEF DESCRIPTION OF THE DRAWINGS

The accompanying drawings are included to provide a further understanding and are incorporated in and constitute a part of this specification. The drawings illustrate one or more embodiment(s), and together with the description serve to explain principles and operation of the various embodiments. Features and attributes associated with any of the embodiments shown or described may be applied to other embodiments shown, described, or appreciated based on this disclosure.

DETAILED DESCRIPTION

Various embodiments will be further clarified by examples in the description below. In general, the description relates to individual cable assemblies that are bundled together for use in a mesh network or other similar network topology. The individual cable assemblies are selected and bundled in a particular manner to greatly reduce the amount of time and effort required to install the mesh network compared to conventional approaches. This can be particularly advantageous when the mesh network is implemented by network equipment supported in a series of equipment racks.

Figure 2:
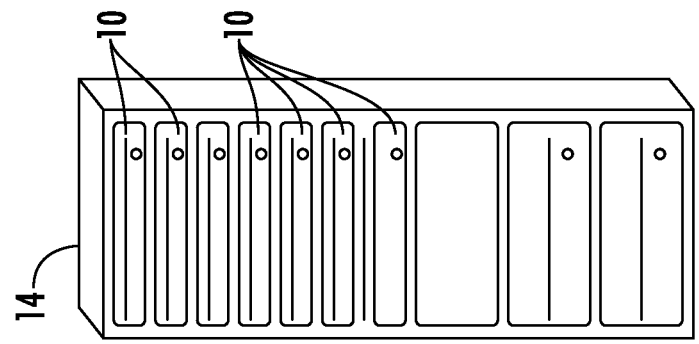
FIG. 2 is a schematic isometric view of an example equipment rack that supports network equipment.
Figure 1:
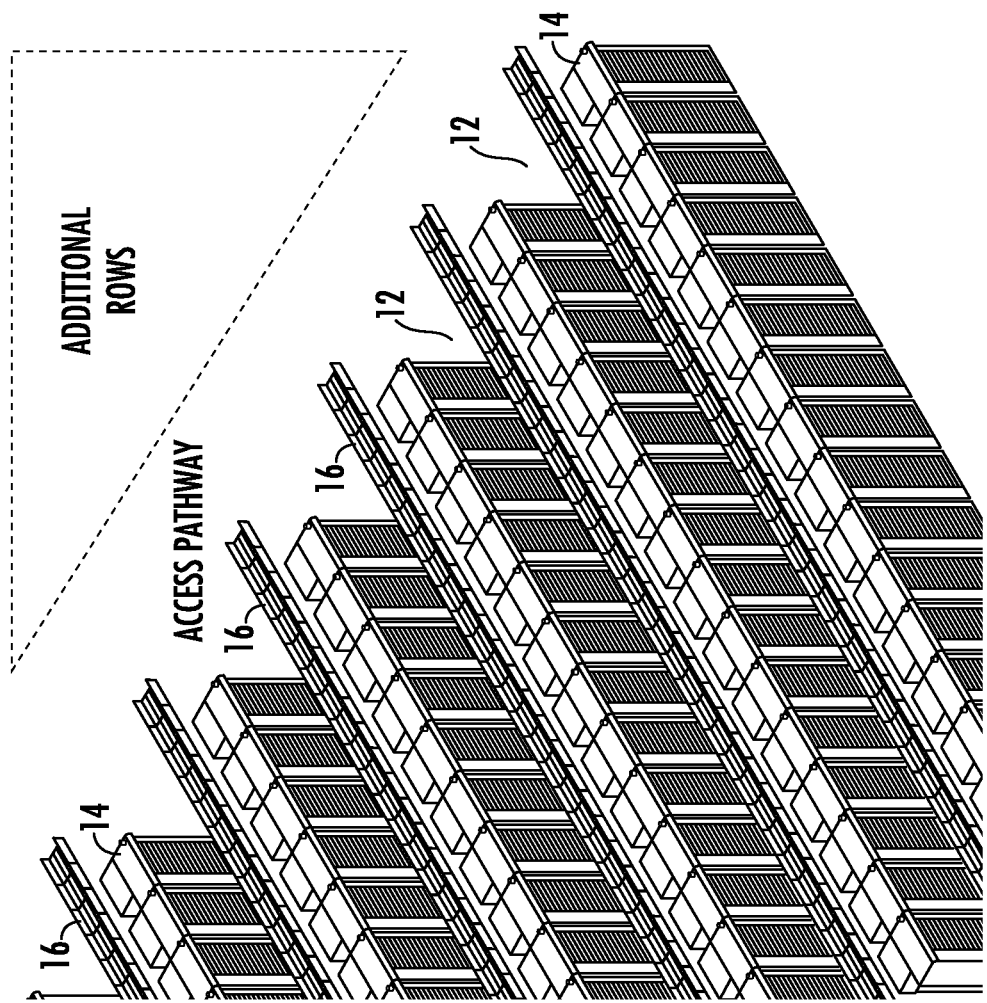
FIG. 1 is a perspective view of an example layout for a data hall in a data center.

To this end, as shown in FIGS. 1 and 2, various network equipment 10 in a data center may be arranged in one or more data halls that generally include a plurality of spaced-apart rows 12. The arrangement of the data halls into rows 12 helps organize the large number of network equipment 10, optical fiber cables, optical connections, etc. Access pathways may run transverse to the rows 12, and there may be rows 12 on both sides of an access pathway. Each of the rows 12 includes a plurality of racks or cabinets 14 (also referred to simply as "racks 14" in this disclosure) generally arranged one next to the other along the row 12. Each of the racks 14 are vertically-arranged frames for holding various network equipment 10 of the data center. The network equipment 10 is illustrated generically in FIG. 2, but may be any type of network equipment having connection ports for a telecommunications cable. For example, the network equipment 10 may be switch or a server, such as a compute processing unit (CPU) server or a general processing unit (GPU) server.

A particular row 12 or series of racks 14 may represent a cluster or pod for high performance computing. To form a mesh network, there is at least one network equipment 10 in each rack 14 that requires direct connection to at least one network equipment 10 in each of the other racks 14 of the cluster. Cable supports or trays 16 are disposed above each row 12 for routing the cabling infrastructure (not shown in FIG. 1) that achieves such connections. Rather than separately installing individual cable assemblies for the cabling infrastructure, a bundled cable assembly according to this disclosure may be used.

Having described an example environment, a specific example of a bundled cable assembly will be described to illustrate principles of this disclosure. The bundled cable assembly will be described in the context of a simplified mesh network involving a relatively small number of equipment racks that each support a small number of network equipment. This is merely to simplify the description, but those skilled in cabling infrastructure for data center networks will appreciate that the number of equipment racks and number of network equipment involved in a mesh network may be much larger, and that the principles described for the example bundled cable assembly may be applied to other embodiments for such larger networks.

Figure 3:
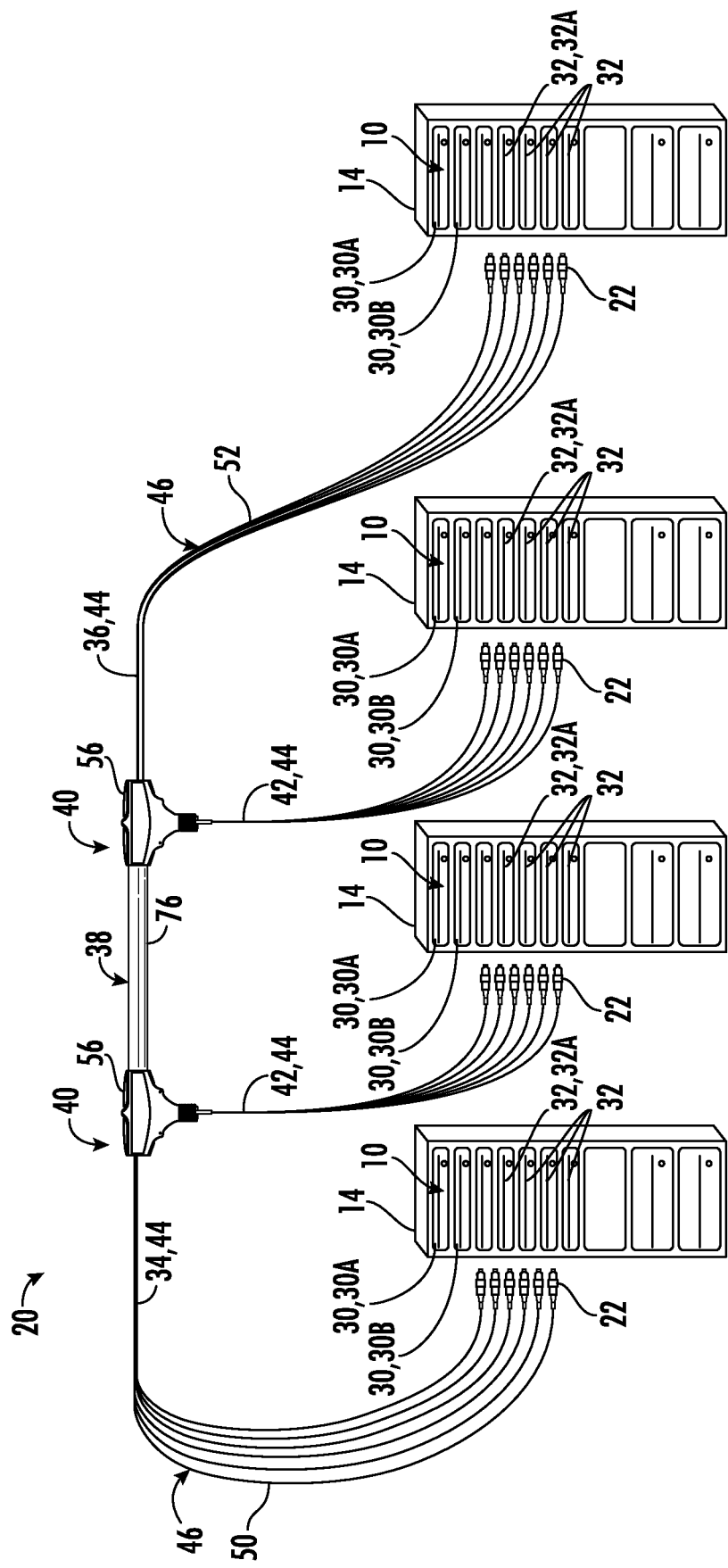
FIG. 3 is a schematic view of one embodiment of a bundled cable assembly according this disclosure extending to different equipment racks that are arranged in series.

With this in mind, FIG. 3 illustrates a bundled cable assembly 20 according to one embodiment of this disclosure. The bundled cable assembly 20 in this embodiment is intended for use in a mesh network involving a series of four equipment racks 14 that each support network equipment 10. At least one network equipment 10 in each rack 14 includes connection ports (not labeled) to which connectors 22 of the bundled cable assembly 20 can be coupled to establish optical connections with that network equipment 10. In this manner, the bundled cable assembly 20 is configured to establish direct optical links between connection ports of a given network equipment 10 in a given rack 14 and connection ports of network equipment 10 in different racks 14. Stated differently, the bundled cable assembly 20 is configured so that a given network equipment 10 of a given rack 14 is connected to network equipment 10 in each of the other racks 14.

As a specific example, each rack 14 may support one or more switches 30 at or near a top of the rack 14 and one or more servers 32 at locations in the rack 14 below the switch(es) 30. The bundled cable assembly 20 may be used to connect at least a first switch 30A (hereinafter "switch 30A") in each rack 14 to at least a first server 32A in each of the other racks 14. In general, the bundled cable assembly 20 includes a first end section 34, a second end section 36, and a main section 38 extending between the first end section 34 and the second end section 36. The main section 38 includes a plurality of tap locations 40 at spaced apart locations along a length of the main section 38. Only two tap locations 40 are provided in the embodiment shown, but in alternative embodiments there may be a greater number of tap locations 40. The bundled cable assembly 20 also includes a plurality of tap sections 42 each extending from a respective tap location 40. The first end section 34, the second end section 36, and the plurality of tap sections 42 are considered generically as terminal sections 44 of the bundled cable assembly 20 and are sometimes referred to as such in this disclosure.

Individual cable assemblies 46 are bundled together in at least some of the main section 38 to define the bundled cable assembly 20. The individual cable assemblies 46 may be optical cables assembled with an optical connector 22 ("connector 22") at each end thereof. Such cable assemblies are known as "patch cords" or "jumpers," and the latter term will be used in this disclosure to simplify the description. Thus, jumpers according to this disclosure comprise one or more optical fibers carried within a cable jacket as part of a cable, with the optical fiber(s) being terminated by an optical connector at each end of the cable. The connectors 22 may each be any suitable optical connector, such as an LC connector for single or two-fiber cable assemblies, or a multi-fiber push-on (MPO) connector for multi-fiber cable assemblies (e.g., with 8, 12, 16, or 24 optical fibers). The type of connector used will depend on the type of connection port in the network equipment 10 intended to be connected by the bundled cable assembly 20.

Still referring to FIG. 3, each of the jumpers 46 has a first jumper end 50 in one of the terminal sections 44 of the bundled cable assembly 20 and a second jumper end 52 in another one of the terminal sections 44. The arrangement of the jumpers 46 in relation to the terminal sections 44 will be described in further detail below. As will become apparent, the jumpers 46 are organized into different groups. There are at least as many groups of jumpers 46 as there are equipment racks 14 in the example shown, i.e. at least four groups of jumpers 46 based on four equipment racks 14. Such an arrangement allows each jumper 46 within a group to extend from common network equipment 10 in one of the racks 14 to different network equipment 10 in different racks 14. Stated another way, each of the terminal sections 44 of the bundled cable assembly 20 comprises the first jumper ends 50 from a respective one of the groups of jumpers 46 and a second jumper end 52 from each of the other groups of jumpers 46.

Figure 5:
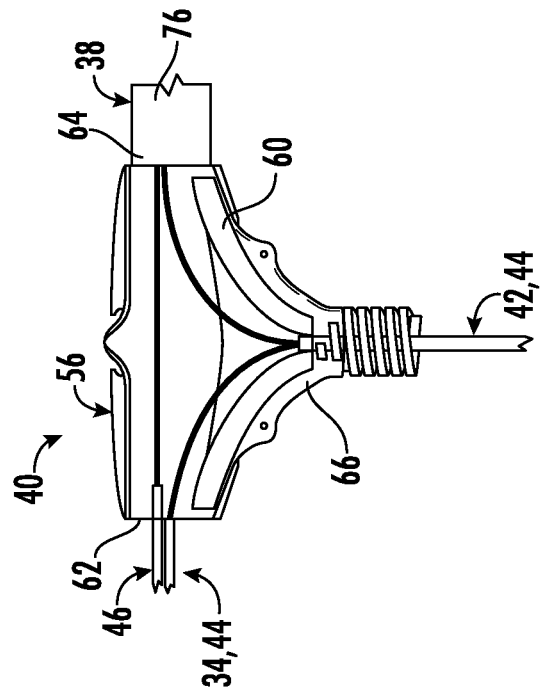
FIG. 5 is similar to FIG. 4, but illustrates the tap housing with a component thereof removed to view an interior of the tap housing.
Figure 4:
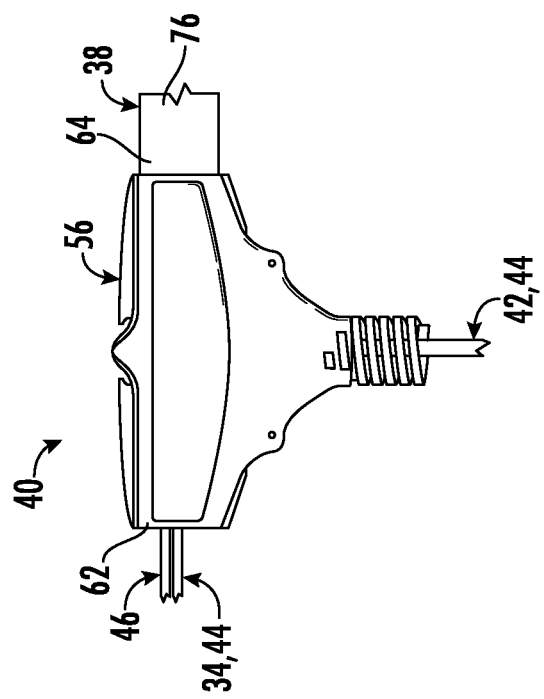
FIG. 4 is a close up view of a first tap location in the bundled cable assembly of FIG. 3, with the tap location being defined by a tap housing.

In the embodiment shown in FIG. 3, the tap locations 40 are each defined by a respective tap housing 56. FIGS. 4 and 5 illustrate a first one of the tap locations 40, and therefore one of the tap housings 56, in further detail. The tap housing 56 may be formed from shells or body pieces that are joined together by fasteners, a snap-fit, adhesive, or any other suitable technique. A main passage 60 opens at opposing ends 62, 64 of the tap housing 56 to allow at least some jumpers 46 in the main section 38 to extend through the main passage 60. For example, in the tap housing 56 shown in FIGS. 4 and 5, at least some jumpers 46 in the main section 38 extend through the main passage 60 to the first end section 34. At the other tap location 40 for the bundled cable assembly 20 of FIG. 3, at least some jumpers 46 in the main section 38 extend through the main passage 60 of the tap housing 56 to the second end section 36. In embodiments with more than two tap locations 40, the main passage 60 for other tap housings 56 allows jumpers 46 in the main section 38 to extend between different portions of the main section 38. A common design for the tap housing 56 may be used for each of the tap locations 40, or there may be different tap housing designs for different tap locations 40. For example, in alternative embodiments involving more than two tap locations 40, the tap housings at the ends of the main section 38 may have a design different than the tap housings that are between different portions of the main section 38.

Still referring to FIGS. 4 and 5, the tap housing 56 also includes an auxiliary passage 66 extending through a side 68 of the tap housing that is between the opposing ends 62, 64. More specifically, the auxiliary passage 66 extends between an exterior of the tap housing 56 and the main passage 60. The tap section 42 that is associated with the tap location 40 defined by the tap housing 56 extends through the auxiliary passage 66. As shown in FIG. 5, the tap section 42 is formed by one or more jumpers 46 branching off from the first end section 34 and one or more jumpers 46 branching off from the main section 38. At the other tap location 40 of the bundled cable assembly 20, the tap section 42 is formed by one or more jumpers 46 branching off from the second end section 36 and one or more jumpers 46 branching off from the main section 38. In embodiments with more than two tap locations 40, other tap sections 42 can be formed from: (a) one or more jumpers 46 branching off from a portion of the main section 38 that enters the tap housing 56 at one of the ends 62, 64, and (b) one or more jumpers 46 branching off from a portion of the main section 38 that enters the tap housing 56 at the other of the ends 62, 64.

Referring collectively to FIGS. 3-5, the main section 38 includes a jacket 76 (also referred to as a cover in this disclosure) that bundles the jumpers 46 together between the tap locations 40. The jacket 76 is a tube or casing in the embodiment shown through which the jumpers 46 extend, and will be referred to hereinafter as "tube 76". For example, the jumpers 46 may be inserted through the tube 76 during the process of making the bundled cable assembly 20. Alternatively, the tube 76 may be slit (not shown) along its length so that the tube 76 can be applied over the jumpers 46 by feeding the jumpers 46 through the slit. The tube 76 extends between two successive tap housings 56 in the embodiment shown and terminates at or even slightly within the tap housings 56. In alternative embodiments, the tube 76 or other jacket may only cover a partial length of the main section 38 between two successive tap locations 40. Thus, there is at least some bundling of the jumpers 46 in the main section 38 between two successive tap locations 40, but the bundling need not be continuous over an entire length of the main section 38 between the tap locations 40. The bundling occurs by way of the jumpers 46 being held together so that they can be routed/positioned as a unit at the bundled locations. Many different ways of bundling will be appreciated by persons skilled in cabling design. The jumpers 46, for example, may be held together by the tube 76 or another cover, such as by being wrapped with packaging, tape, or the like, and/or by other methods. Although the terminal sections 44 are shown as not including the jumpers 46 bundled together, alternative embodiments may include some length of the jumpers 46 in one or more of the terminal sections 44 being bundled together. For example, a short length of each terminal section 44 extending from the respective tap location 40 may bundle the jumpers 46 of that terminal section 44 together.

Having generally described the bundled cable assembly 20, the grouping and arrangement of the jumpers 46 that was mentioned above will now be described in further detail. The grouping can be better appreciated when describing an embodiment where each of the different groups of jumpers 46 are associated with a different color. Although there are certain advantages of such color association that will be described below, this disclosure is not limited to embodiments with color association for the groups of jumpers 46. Embodiments are possible where the jumpers 46 are grouped and arranged in same manner described below, but without having any color association.

With this in mind, in some embodiments color association may be achieved by making a component of the jumpers 46 that define a group a particular color. For example, the connector 22 on the first jumper end 50 and the connector 22 on the second jumper end 52 of a jumper 46 may include a component formed with the particular color associated with the group to which the jumper 46 belongs. Many connector components, such as connector bodies/housings, or sub-components thereof, are molded from plastic materials whose coloring can be adjusted with pigments. The cable of a jumper 46 may alternatively or additionally be formed with the particular color associated with the group to which the jumper 46 belongs. In some embodiments, connector components or cables for the jumpers may instead have colored labels or colored stickers to for the connectors 22 and/or cables to include the color for the associated group of jumpers 46.

Figure 6:
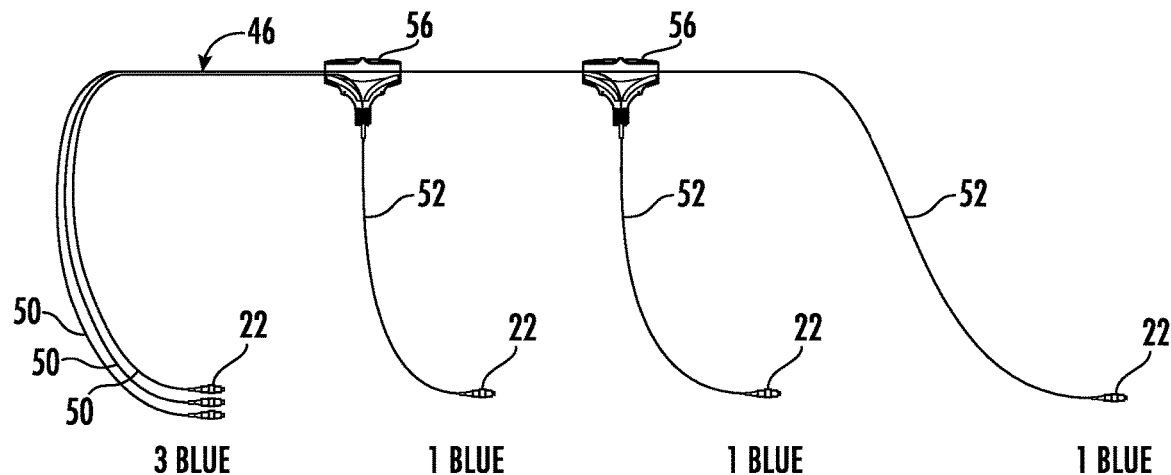
FIGS. 6-9 are schematic views sequentially illustrating an example method of making the bundled cable assembly of FIG. 3.

FIG. 6 illustrates a first group of jumpers 46 associated with the color blue. The group comprises three jumpers 46, which will be referred to as "blue jumpers" due to the color association. Each of the blue jumpers 46 has a first jumper end 50 arranged/position to eventually become the first end section 34 (FIG. 3) of the bundled cable assembly 20 and a second jumper end 52 arranged/positioned to eventually become one of the other terminal sections 44 of the bundled cable assembly 20. The second jumper ends 52 will be part of different terminal sections 44. Thus, the blue jumpers 46 have their first jumper ends 50 generally arranged together for connecting to network equipment 10 in a first rack 14 in a series of racks 14 (e.g., the leftmost rack 14 in FIG. 3). As shown in FIG. 6, the blue jumpers 46 enter the first tap housing 56, where one of them branches off from the remaining blue jumpers 46 so that the corresponding second jumper end 52 is positioned for being part of the a first tap section 42 (FIG. 3). The remaining blue jumpers 46 continue to the next tap housing 56, where another blue jumper 46 branches off so that the corresponding second jumper end 52 is positioned for being part of the second tap section 42 (FIG. 3). The final, remaining blue jumper 46 then has the corresponding second jumper end 52 extending from the second tap housing 56 to be positioned for being part of the second end section 36 (FIG. 3) of the bundled cable assembly 20.

Figure 7:
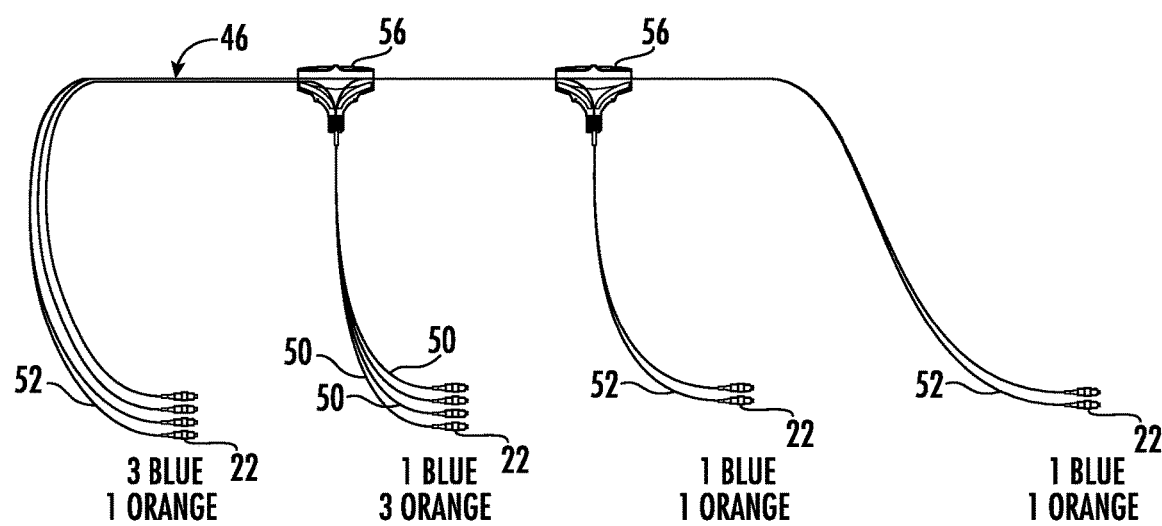

FIG. 7 illustrates a second group of jumpers 46 associated with the color orange ("orange jumpers") and overlaid onto/assembled with the first group of jumpers 46. The second group comprises the same number of jumpers 46 as the first group, i.e. three jumpers 46, but the first jumper ends 50 for the orange jumpers 46 are arranged/positioned for being part of the first tap section 42 (FIG. 3) of the bundled cable assembly 20. The orange jumpers 46 enter the first tap housing 56, where one of them branches off from the remaining orange jumpers 46 so that the corresponding second jumper end 52 can be part of the first end section 34. The remaining orange jumpers 46 continue as part of the main section 38 to the next tap housing 56, where another orange jumper 46 branches off so that the corresponding second jumper end 52 can be part of the second tap section 42. The final, remaining orange jumper 46 then has the corresponding second jumper end 52 extending from the second tap housing 56 to be part of the second end section 36 of the bundled cable assembly 20.

Figure 8:
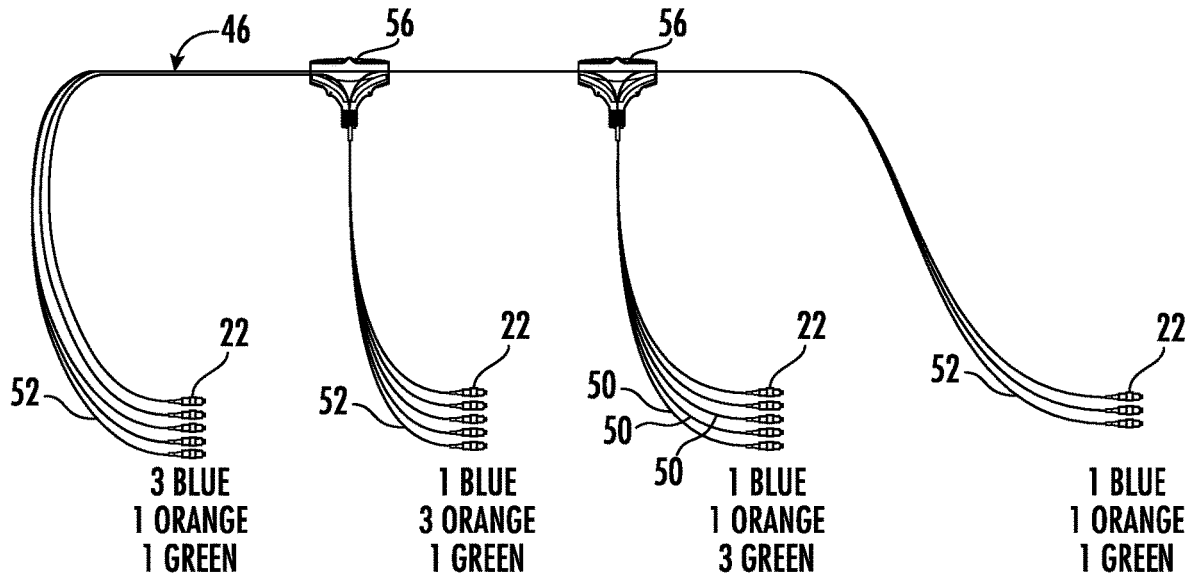

FIG. 8 illustrates a third group of jumpers 46 associated with the color green ("green jumpers") and overlaid onto/assembled with the first and second groups of jumpers 46. The third group comprises the same number of jumpers 46 as the first and second groups, i.e. three jumpers 46, but the first jumper ends 50 for the green jumpers are arranged to be part of the second tap section 42 (FIG. 3) of the bundled cable assembly 20. The green jumpers 46 enter the second tap housing 56, where one of them branches off from the remaining green jumpers 46 so that the corresponding second jumper end 52 can be part of the second end section 36. The remaining green jumpers 46 continue as part of the main section 38 to the first tap housing 56, where another green jumper 46 branches off so that the corresponding second jumper end 52 can be part of the first tap section 42. The final, remaining green jumper 46 then has the corresponding second jumper end 52 extending from the first tap housing 56 to be part of the first end section 34 of the bundled cable assembly 20.

Figure 9:
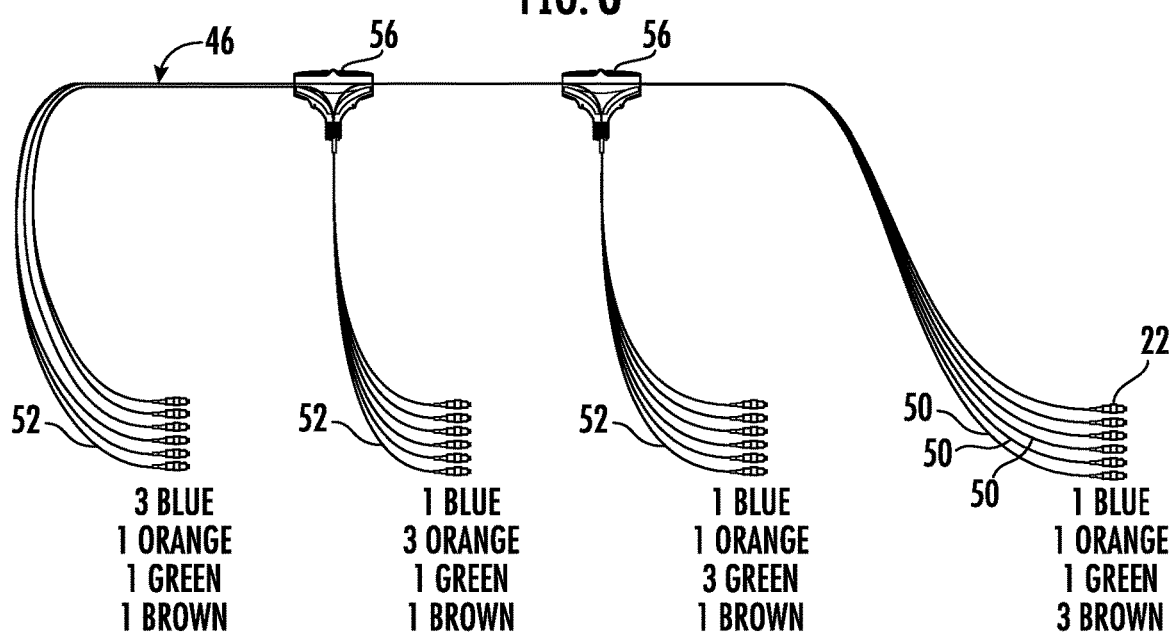

FIG. 9 illustrates a fourth group of jumpers 46 associated with the color brown ("brown jumpers") and overlaid onto/assembled with the first, second, and third groups of jumpers 46. The fourth group comprises the same number of jumpers 46 as the first, second, and third groups, i.e. three jumpers 46, but the first jumper ends 50 for the brown jumpers 46 are arranged to be part of the second end section 36 (FIG. 3) of the bundled cable assembly 20. The brown jumpers 46 enter the second tap housing 56, where one of them branches off from the remaining brown jumpers 46 so that the corresponding second jumper end 52 can be part of the second tap section 42. The remaining brown jumpers 46 continue to the first tap housing 56, where another brown jumper 46 branches off so that the corresponding second jumper end 52 can be part of the first tap section 42. The final, remaining brown jumper 46 then has the corresponding second jumper end 52 extending from the first tap housing 56 to be part of the first end section 34 of the bundled cable assembly 20.

As can be appreciated, FIGS. 6-9 sequentially illustrate steps of an example method of making the bundled cable assembly 20 (FIG. 3). The steps may be performed on an elongated table or other work surface (not shown). The tap housings 56 are first positioned relative to each other to correspond to the tap locations 40. The jumpers 46 are then arranged/positioned relative to the tap housings 56, one group of jumpers 46 at a time. Although FIGS. 6-9 illustrate the first group of jumpers 46 being handled first in the method, and the remaining groups being handled in sequential order (second-third-fourth), which group of jumpers 46 is handled in which order may be different in other embodiments.

During the arranging/positioning of the jumpers 46, and as shown in FIGS. 6-9, the tap housings 56 may be in an open or disassembled state. This allows a technician to route each jumper 46 in the correct manner with respect to the tap housings 56. Consistent with the description of FIGS. 4 and 5 above, the technician either routes the jumper 46 completely through the main passage 60 of a tap housing 56 or branches the jumper 46 off from other jumpers 46 in the same group to extend through the auxiliary passage 66. Once all jumpers 46 of all groups have been positioned, the technician may close or otherwise complete assembly of the tap housings 56 so that the jumpers 46 are held therein with the desired arrangement/routing pattern.

Although not illustrated in FIGS. 6-9, the tube 76 (FIG. 3) may be positioned between the tap housings 56 before arranging the jumpers 46. This allows the technician to extend the jumpers 46 through the tube 76 when positioning the jumpers 46. Alternatively, as mentioned above, a cover may be applied over portions of the jumpers 46 after the jumpers 46 are positioned to have the arrangement shown in FIG. 9. That is, the jumpers 46 may first be arranged/positioned to define the main section 38 and terminal sections 44, and then a cover may be applied to bundle the jumpers 46 together in at least some of the main section 38. The construction of the cover (e.g., solid tube, split sleeve, wrapping material, etc.) may make one approach more suitable than others.

In some embodiments, the cover that bundles the jumpers 46 together may be removable in whole or in part. This removability, along with the ability to disassemble/open the tap housings 56, may be desirable for maintenance and repair of the jumpers 46. For example, at some point during use of the bundled cable assembly 20, one or more of the jumpers 46 may fail and require replacement. Technicians may need to then remove a failed jumper 46 from the bundled cable assembly 20 while still leaving the other jumpers 46 intact, even after installation of the bundled cable assembly 20 in a data center as part of a decommissioning process. If the cover(s) received over the failed jumper 46 and the tap housing(s) 56 through which the failed jumper 46 extend can be opened, the technicians have the ability to remove the failed jumper 46 more easily.

In some embodiments, the manner in which the jumpers 46 are positioned relative to each other when making the bundled cable assembly 20 further assists with removability for decommissioning, if needed. For example, the method described above with reference to FIGS. 6-9 includes overlaying the jumpers 46 of each group on top of any previously-positioned jumpers 46 from other groups. This results in the jumpers 46 being arranged in a non-stranded configuration. Other methods of forming a non-stranded configuration are also possible. The non-stranded configuration can be maintained in at least the main section 38 during any remaining steps (e.g., applying a cover over portions of the main section 38) of making the bundled cable assembly 20. Therefore, if a technician needs to later remove a jumper 46 for decommissioning, the technician can more easily separate the jumper 46 from the remaining jumpers 46. There may not be a need to un-strand or otherwise disentangle the jumpers 46. Indeed, in some embodiments, within at least the main section 38 of the bundled cable assembly 20, no jumper 46 from any of the groups wraps more than 360 degrees around another jumper 46. The terminal sections 44 may also have this characteristic or otherwise maintain the non-stranded configuration, but because the first jumper end 50 or second jumper end 52 of the jumpers 46 in each terminal section 46 are accessible, the jumpers 46 in the terminal sections 44 may be easier to un-strand or disentangle if needed when attempting to remove one the jumpers 46.

Figure 10:
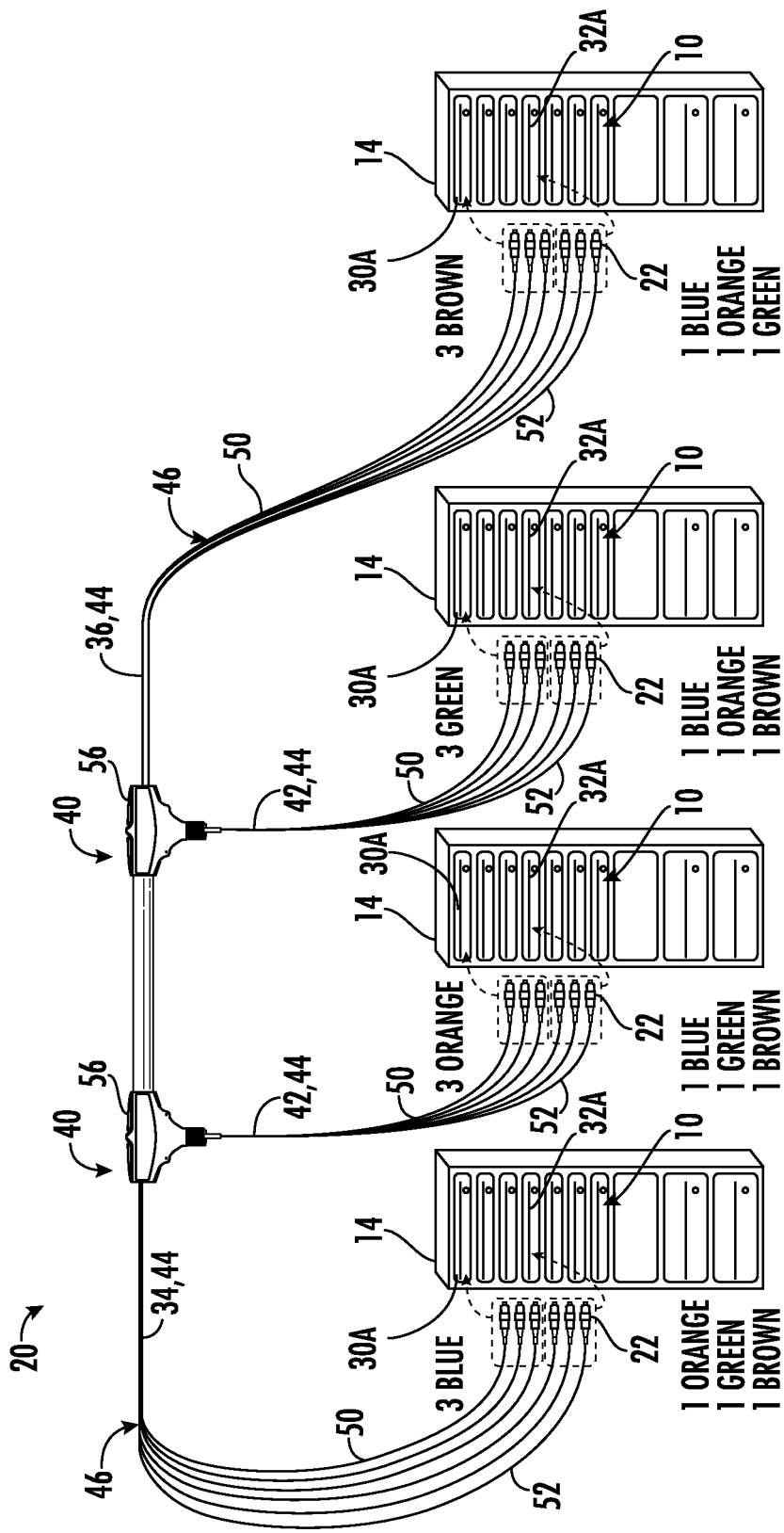
FIG. 10 is a schematic view similar to FIG. 3, but includes annotations relating to groups of jumpers that define the bundled cable assembly and annotations relating which network equipment is intended to be connected by the jumpers of the different groups.

FIG. 10 schematically illustrates the bundled cable assembly 20 in use, similar to FIG. 3 but with additional annotations relating to the groups of jumpers 46. As represented in FIG. 10, the first jumper ends 50 of the blue jumpers 46 may be connected to the switch 30A in the first rack 14. The respective connectors 22 that terminate the first jumper ends 50 plug into a respective connection port on the switch 30A. The bundled cable assembly 20 is constructed such that the second jumper ends 52 of the blue jumpers 46 are in different terminal sections 44 of the bundled cable assembly 20, as mentioned above. The different terminal sections 44 extend to the different racks 14 and establish connections to the first servers 32A in the different racks 14. In particular, the connector 22 that terminates the second jumper end 52 of a blue jumper 46 plugs into a respective connection port on the first server 32A in the second rack 14, the connector 22 that terminates the second jumper end 52 of another blue jumper 46 plugs into a respective connection port on the first server 32A in the third rack 14, and the connector 22 that terminates the second jumper end 52 of another blue jumper 46 plugs into a respective connection port on the first server 32A in the fourth rack 14.

The other groups of jumpers 46 may be used in a similar manner, with each group establishing optical links between the switch 30A in a different rack 14 and each of the first servers 32A in the other racks 14. Therefore, the orange jumpers 46 may establish optical links between the switch 30A in the second rack 14 and the first server 32A in each of the other racks 14, the green jumpers 46 may establish optical links between the switch 30A in the third rack 14 and the first server 32A in each of the other racks 14, and the brown jumpers 46 may establish optical links between the switch 30A in the fourth rack 14 and the first server 32A in each of the other racks 14.

The bundled cable assembly 20 can greatly reduce the amount of time required to establish the various optical links compared to installing individual jumpers one-at-time. Technicians can quickly and easily place the main section 38 of the bundled cable assembly 20 in a cable tray 16 and extend each terminal section 44 to a different rack 14. The tap locations 40 may be spaced apart to generally correspond to spacing between the racks 14 so technicians can easily understand which tap section 42 is intended for which rack 14. This reduces or eliminates the risk of losing track of which jumper 46 is intend for which rack 14, which sometimes occurs when installing jumpers one-at-a-time. Additionally, the bundled cable assembly 20 is configured so that there is approximately the same amount of cable slack in the terminal sections 44 when the bundled cable assembly 20 is installed. The need to even out cable slack that exists with installing jumpers one-at-a-time is therefore avoided. The same can be said about the need for post-routing dressing (grooming) in the cable tray 16. Because the main section 38 of the bundled cable assembly 20 bundles the jumpers 46 together, the jumpers 46 may not require any further organization in the cable tray 16 after routing the bundled cable assembly 20.

Within each rack 14, the connections to the network equipment 10 can also be established quickly and easily. The different colored components on the jumpers 46 in the terminal section 44 for the rack 14 may enable technicians to quickly identify the first jumper ends 50 intended for the switch 30A and the second jumper ends 52 intended for the first server 32A. For example, at the first rack 14, the first jumper ends 50 of the blue jumpers 46 may be easily distinguishable from the second jumper ends 52 due to the common color of components on the first jumper ends 50. A technician can easily locate the first jumper ends 50 of the three blue jumpers 46 without having to scrutinize labels with small print or that might otherwise be hard to read. The technician can then connect these first jumper ends 50 to the corresponding connection ports on the switch 30A with only needing to know a number or some other designation for the intended connection port location. The number can be placed on the connector 22, cable, or a label in a prominent manner, possibly separate from any additional information about the intended network equipment 10 (the switch 30A in this case) and/or intended rack 14 since the technician may not need to scrutinize such additional information for the reason mentioned above.

Similarly, a technician can quickly identify the second jumper ends 52 by way of their different colors. The technician can gather the second jumper ends 52 and connect them to corresponding connection ports on the first server 32A with only needing to know a number or some other designation for the intended connection port location. As with the first jumper ends 50, the number can be placed on the connector 22, cable, or a label in a prominent manner, possibly separate from any additional information about the intended network equipment 10 (the first server 32A in this case) and/or intended rack 14 since a technician may not need to scrutinize such additional information for the reason mentioned above.

Advantageously, in some embodiments the different groups of jumpers 46 are associated with different colors according to a coloring scheme with a predefined order. For example, in some embodiments each of the different colors for the groups of jumpers 46 may comprise an optical fiber color according to EIA/TIA-568-A. That standard sets out a coloring scheme used extensively in the optical communications industry and, therefore, is familiar to persons skilled in the field of optical communications. The coloring scheme comprises particular colors in a particular order, as set out in the table below:

| Position | Color |
|---|---|
| 1 | Blue |
| 2 | Orange |
| 3 | Green |
| 4 | Brown |
| 5 | Slate |
| 6 | White |
| 7 | Red |
| 8 | Black |
| 9 | Yellow |
| 10 | Violet |
| 11 | Rose |
| 12 | Aqua |

In the example embodiment described above, the first group of jumpers 46 is associated with the first color in the scheme above (blue), the second group of jumpers 46 is associated with the second color in the scheme above (orange), the third group of jumpers 46 is associated with the third color in the scheme above (green), and the fourth group of jumpers 46 is associated with the fourth color in the scheme above (brown). Therefore, the second jumper ends 52 in a given terminal section 44 can be associated with the order/sequence of the coloring scheme. A technician, for example, can gather the second jumper ends 52 in a terminal section 44, observe the different colors, associate the colors with the order of the coloring scheme, and use that ordering to determine which connection port on the first server 32A is intended for each second jumper end 52. The first server 32A may have the connection ports numbered or arranged such that the technician understands what is considered a first connection port, a second connection port, a third connection port, and so on. As an example, if the second jumper end 52 held by the technician is that of a blue jumper 46, the technician will understand to plug the connector 22 of that second jumper end 52 into the first connection port of the server 32A. And if the second jumper end 52 held by the technician is that of an orange jumper 46, the technician will understand to plug the connector 22 of that second jumper end 52 into the second connection port of the server 32A. This pattern can continue until each second jumper end 52 within a terminal section 44 is connected to the intended connection port on the server 32A in the rack 14 for that terminal section 44. Thus, there may not be a need for a technician to read or scan labels before establishing connections, which can further contribute to a faster installation compared to conventional methods.

The principles described above with reference to the bundled cable assembly 20 can be applied to other embodiments involving more equipment racks 14 and more connections between network equipment 10. Indeed, a series of racks 14 for a network may be generically expressed as having n racks in the series. The embodiment shown in FIGS. 3 and 10 involves four racks 14 such that n=4 in that embodiment. Although embodiments of a bundled cable assembly according to this disclosure are possible for when n<4, the advantages of such embodiments compared to installing individual jumpers one-at-a-time may be less apparent. Thus, according to some embodiments of this disclosure, n≥4. Other considerations may make it desirable to only use bundled cable assemblies according to this disclosure when n is below a certain number. For example, according to some embodiments of this disclosure, n≤36, or n≤24, or n≤12 due to the limited number of connection ports on network equipment, the additional complexity to make the bundled cable assembly for such embodiments, and/or other factors.

The embodiment shown in FIGS. 3 and 10 implement the general principle that a bundled cable assembly according this disclosure may be defined by n groups of jumpers 46 that are bundled together in at least some of the main section 38, and that each of the n groups of jumpers 46 may consist of (n−1) jumpers 46. Embodiments are also possible where there are n groups of jumpers 46 that each comprise more than (n−1) jumpers 46.

Figure 11:
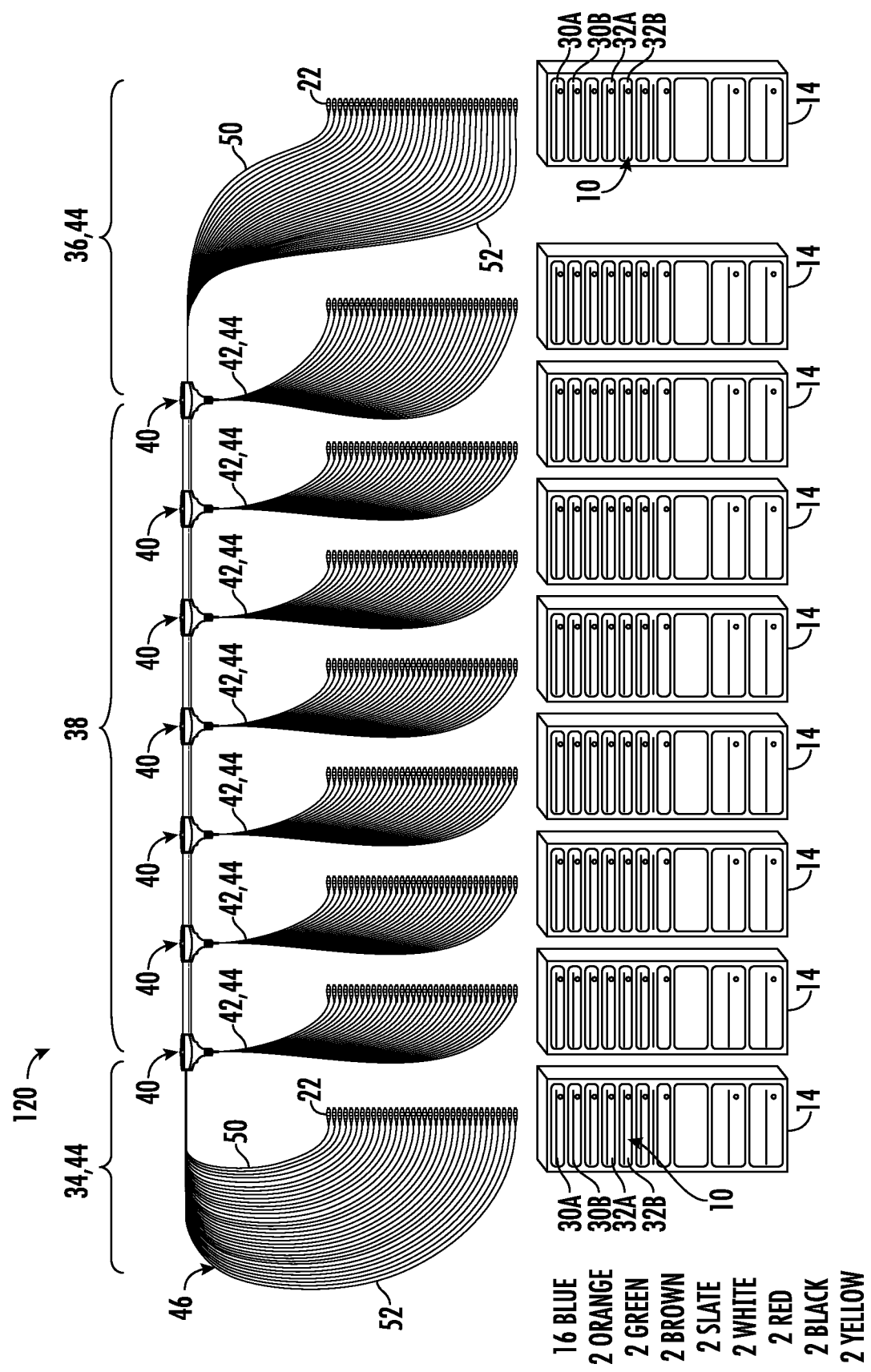
FIG. 11 is a schematic view of an example bundled cable assembly according to another embodiment of this disclosure for interconnecting network equipment in a series of equipment racks.

To this end, FIG. 11 illustrates an example of how these general principles may be extended to other embodiments. The same reference numbers are used where appropriate to refer to elements corresponding to those discussed above for the embodiment of FIGS. 3 and 10. In FIG. 11, there is a series of nine equipment racks 14 such that n=9 in the embodiment shown. A bundled cable assembly 120 includes nine terminal sections 44 for connecting to network equipment 10 in the nine racks 14. Thus, the number of terminal sections 44 corresponds to the number of racks 14, like the embodiment in FIGS. 3 and 10. A first terminal section 44 (on the left in FIG. 11) can still be considered a first end section 34 for connecting to network equipment 10 in a first rack 14 of the series, and a final terminal section 44 (on the right in FIG. 11) can still be considered a second end section 36 for connecting to network equipment 10 in a final rack 14 of the series. Additionally, like the embodiment in FIGS. 3 and 10, the number of tap locations 40 corresponds to the number of racks 14 between the first and final racks 14.

The bundled cable assembly 120 is defined by n groups of jumpers 46 like the bundled cable assembly 20 (FIGS. 3 and 10). The n groups of jumpers 46 are also associated with n different colors in the embodiment shown. Specifically, each of the n groups of jumpers 46 is associated with a different color based on the table discussed above for the bundled cable assembly 20, i.e. associated with a different optical fiber color according to EIA/TIA-568-A. However, in this embodiment, each of the n groups of jumpers 46 comprises two jumpers 46 for extending from one of the n racks 14 to each of the other n racks 14. That is, there is a pair of jumpers 46 for each of the n racks 14, resulting in a total of 2*(n−1) jumpers per group, which is sixteen jumpers 46 per group in the embodiment shown. Each terminal section 44 therefore includes the first jumper ends 50 of the 2*(n−1) jumpers from one of the n groups (sixteen jumpers from one group in the embodiment shown) and the second jumper ends 52 of the pairs of jumpers 46 from each of the other n groups (collectively sixteen jumpers from the other groups in the embodiment shown).

In other embodiments, each of the n groups may include more than two jumpers 46 for extending from any given one of the n racks 14 to each of the other n racks 14. In general, each of the groups may include m jumpers 46 for extending from any given one of the n racks 14 to each of the other n racks 14, wherein m is an integer 1. The total number of jumpers 46 per group may then be expressed as m*(n−1) jumpers, resulting in each terminal section 44 including: (a) the first jumper ends 50 of the m*(n−1) jumpers from one of the n groups, and (b) the second jumper ends 52 of m jumpers 46 from each of the other n groups. In other words, each terminal section 44 includes 2*m*(n−1) jumpers in such embodiments.

Within a terminal section 44, when there are two or more second end sections 52 for a group of jumpers 46 (e.g., m≥2), the two or more second end sections 52 may connect to different network equipment 10. The first end section 34 of the bundled cable assembly 120 and first rack 14 in FIG. 11 (the leftmost rack 14 shown) will be discussed as an example to illustrate this aspect. As shown in FIG. 11, the first rack 14 supports both the first server 32A and a second server 32B. One of the second jumper ends 52 from each of the eight pairs of colored jumpers 46 in the first end section 34 may connect to the first server 32A, and the other second jumper end 52 from the pair may connect to the second server 32B. In a similar manner, each of the other terminal sections 44 may connect second jumper ends 52 to the first server 32A and the second server 32B in the corresponding rack 14 for the terminal section 44. All of the sixteen first jumper ends 50 for a given group may still connect to the switch 30A in the rack 14 that corresponds to the terminal section 44 comprising the first jumper ends 50. Therefore, the switch 30A in each rack 14 may be connected to both the first server 32A and the second server 32B in each of the other racks 14 by the bundled cable assembly 120.

It will be apparent to those skilled in optical connectivity that various modifications and variations can be made based on this disclosure. For example, although the embodiments described refer to bundled cable assemblies having a certain number of groups of jumpers, with those jumpers from the groups arranged a certain way, this does not preclude embodiments including other jumpers that may not be part of the groups. To this end, in the claims that follow, references to a certain number of elements does not necessarily preclude there being more than that certain number. The invention should be construed to include everything within the scope of the appended claims and their equivalents.

What is claimed is:

1. A bundled cable assembly for interconnecting network equipment that is supported in a series of n equipment racks, wherein n is an integer≥4, the bundled cable assembly comprising:
   a first end section for connecting to network equipment in a first equipment rack of the n equipment racks;
   a second end section for connecting to network equipment in a final equipment rack of the n equipment racks;
   a main section extending between the first end section and the second end section;
   a plurality of tap locations at spaced apart locations along a length of the main section; and
   a plurality of tap sections for connecting to network equipment in a plurality of equipment racks of the n equipment racks that are between the first equipment rack and the last equipment rack, wherein each tap section of the plurality of tap sections extends from a respective tap location of the plurality of tap locations;
   wherein:
      the bundled cable assembly is defined by n groups of jumpers that are bundled together in at least some of the main section,
      each of the n groups comprises a plurality of jumpers that each have a first jumper end and a second jumper end,
      the first end section, the plurality of tap sections, and the second end section define terminal sections of the bundled cable assembly, and
      each of the terminal sections comprises the first jumper ends from a respective group of the n groups of jumpers and at least one second jumper end from each of the other n groups of jumpers.

2. The bundled cable assembly of claim 1, wherein:
   the plurality of tap locations are defined by a plurality of tap housings, and
   each tap housing of the plurality of tap housings comprises a main passage that opens at opposing ends of the tap housing and an auxiliary passage that extends between the main passage and an exterior of the tap housing, wherein at least some of the jumpers in the main section of the bundled cable assembly extend through the main passage, and wherein the tap section that is associated with the tap location defined by the tap housing extends through the auxiliary passage.

3. The bundled cable assembly of claim 2, wherein the plurality of tap housings are secured relative to the main portion of the bundled cable assembly so that the plurality of tap locations are fixed locations along the length of the main portion.

4. The bundled cable assembly of claim 1, wherein:
   each of the n groups of jumpers is associated with a different color, and
   for each group of the n groups of jumpers, the first jumper ends and the second jumper ends of the plurality of jumpers in the group each include a component that has the color associated with the group.

5. The bundled cable assembly of claim 4, wherein for each group of the n groups of jumpers, the component on the first jumper ends and the second jumper ends that has the color associated with the group is an optical connector component.

6. The bundled cable assembly of claim 4, wherein n≤12, and wherein each of the different colors comprises an optical fiber color according to EIA/TIA-568-A.

7. The bundled cable assembly of claim 6, wherein the first end section comprises the first jumper ends from the respective group of the n groups of jumpers that is associated with the first optical fiber color according to EIA/TIA-568-A.

8. The bundled cable assembly of claim 4, wherein n is an integer≤12, wherein the n groups have an order 1 through n such that each of the n groups has a position x in the order, and wherein each of the n groups of jumpers is associated with the different color according to the following table:

| x | color |
| --- | --- |
| 1 | Blue |
| 2 | Orange |
| 3 | Green |
| 4 | Brown |
| 5 | Slate |
| 6 | White |
| 7 | Red |
| 8 | Black |
| 9 | Yellow |
| 10 | Violet |
| 11 | Rose |
| 12 | Aqua |

9. The bundled cable assembly of claim 1, wherein each group of the n groups of jumpers comprises at least (n−1) jumpers.

10. The bundled cable assembly of claim 1, wherein each group of the n groups of jumpers consists of (n−1) jumpers.

11. The bundled cable assembly of claim 1, wherein within at least the main section of the bundled cable assembly, the plurality of jumpers of the n groups of jumpers are arranged in a non-stranded configuration.

12. The bundled cable assembly of claim 1, wherein within at least the main section of the bundled cable assembly, no jumper from the n groups of jumpers wraps more than 360 degrees around another jumper from the n groups of jumpers.

13. A bundled cable assembly for interconnecting network equipment that is supported in different equipment racks, comprising:
n groups of jumpers arranged to define a main section and n terminal sections that each extend from the main section, n being an integer≥4, the main section including a plurality of tap locations at spaced apart locations along a length of the main section, at least some of the jumpers from each of the n groups of jumpers being bundled together in the main section between the plurality of tap locations, and the n terminal sections each extending from one of the tap locations;
wherein:
each of the n groups comprises m*(n−1) jumpers, with m being an integer≥1,
each of the m*(n−1) jumpers includes a first jumper end in one of the n terminal sections and a second jumper end in another of the n terminal sections, and
the n groups of jumpers are arranged such that each of the terminal sections comprises the first jumper ends of the m*(n−1) jumpers from a respective group of the n groups of jumpers and at least one second jumper end from each of the other n groups of jumpers.

14. The bundled cable assembly of claim 13, wherein:
the plurality of tap locations are defined by a plurality of tap housings, and
each tap housing of the plurality of tap housings comprises a main passage that opens at opposing ends of the tap housing and an auxiliary passage that extends between the main passage and an exterior of the tap housing.

15. The bundled cable assembly of claim 13, wherein:
each of the n groups of jumpers is associated with a different color, and
for each group of the n groups of jumpers, the first jumper ends and the second jumper ends of the m*(n−1) jumpers in the group each include a component that has the color associated with the group.

16. The bundled cable assembly of claim 15, wherein for each group of the n groups of jumpers, the component on the first jumper ends and the second jumper ends that has the color associated with the group is an optical connector component.

17. The bundled cable assembly of claim 15, wherein n≤12, and wherein each of the different colors comprises an optical fiber color according to EIA/TIA-568-A.

18. The bundled cable assembly of claim 17, wherein the n terminal sections have an order based on the plurality of tap locations from which the n terminal sections extend, and wherein each of the n terminal sections is associated with the optical fiber color according to EIA/TIA-568A that corresponds to a position of the terminal section in the order.

19. The bundled cable assembly of claim 15, wherein n is an integer≤12, wherein the n groups have an order 1 through n such that each of the n groups has a position x in the order, and wherein each of the n groups of jumpers is associated with the different color according to the following table:

| x | Color |
|---|---|
| 1 | Blue |
| 2 | Orange |
| 3 | Green |
| 4 | Brown |
| 5 | Slate |
| 6 | White |
| 7 | Red |
| 8 | Black |
| 9 | Yellow |
| 10 | Violet |
| 11 | Rose |
| 12 | Aqua |

20. The bundled cable assembly of claim 13, wherein in the main section of the bundled cable assembly, the at least some of the jumpers from each of the n groups of jumpers that are bundled together are arranged in a non-stranded configuration.

21. The bundled cable assembly of claim 13, wherein in the main section of the bundled cable assembly, no jumper from the n groups of jumpers wraps more than 360 degrees around another jumper from the n groups of jumpers.

\* \* \* \* \*